US010924210B2

(12) United States Patent
Chen et al.

(10) Patent No.: US 10,924,210 B2
(45) Date of Patent: Feb. 16, 2021

(54) METHOD, APPARATUS, AND DEVICE FOR DETERMINING POLAR CODE ENCODING AND DECODING

(71) Applicant: HUAWEI TECHNOLOGIES CO., LTD., Shenzhen (CN)

(72) Inventors: Ying Chen, Hangzhou (CN); Rong Li, Hangzhou (CN); Huazi Zhang, Hangzhou (CN); Hejia Luo, Hangzhou (CN); Gongzheng Zhang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/558,285

(22) Filed: Sep. 2, 2019

(65) Prior Publication Data

US 2019/0386778 A1 Dec. 19, 2019

Related U.S. Application Data

(63) Continuation of application No. PCT/CN2018/077852, filed on Mar. 2, 2018.

(30) Foreign Application Priority Data

Mar. 2, 2017 (CN) .......................... 2017 1 0121684

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01); *H04L 1/0068* (2013.01)

(58) Field of Classification Search
CPC ..... H04L 1/0057; H04L 1/0068; H03M 13/13
See application file for complete search history.

(56) References Cited

U.S. PATENT DOCUMENTS 9,362,956 B2 6/2016 Mahdavifar et al.
9,819,361 B2 11/2017 Shin et al.
(Continued)

FOREIGN PATENT DOCUMENTS

CN 103684477 A 3/2014
CN 103778958 A 5/2014

OTHER PUBLICATIONS

Translation of the International Search Report of International Application No. PCT/CN2018/077852, International Searching Authority, State Intellectual Property Office of the P.R. of China, Beijing, China, pp. 1-2, dated Jul. 9, 2018. (Year: 2018).*

(Continued)

*Primary Examiner* — Kyle Vallecillo
(74) *Attorney, Agent, or Firm* — Kilpatrick Townsend & Stockton LLP

(57) ABSTRACT

Embodiments provide a polar code encoding and decoding method in a communications system. Under the method, a basic quantized sequence can be obtained. The basic quantized sequence includes a quantized value used to represent reliability corresponding to a polarized subchannel. A target quantized sequence based on the basic quantized sequence can also be obtained. A relative magnitude relationship between elements in the target quantized sequence is nested with a relative magnitude relationship between elements in the basic quantized sequence. K largest quantized values in the target quantized sequence can be determined based on a non-fixed bit length K and polarized subchannels corresponding to the K largest quantized values can be used as a non-fixed bit position set. Polar code encoding or decoding can be performed based on the non-fixed bit position set.

16 Claims, 9 Drawing Sheets

(56) References Cited

U.S. PATENT DOCUMENTS

| | | | |
|---|---|---|---|
| 2012/0266040 A1* | 10/2012 | Hamkins | H03M 13/6591 |
| | | | 714/752 |
| 2013/0117244 A1* | 5/2013 | Kim | G06F 21/6227 |
| | | | 707/694 |
| 2014/0108748 A1 | 4/2014 | Lee et al. | |
| 2014/0331083 A1* | 11/2014 | Aliev | G06F 11/108 |
| | | | 714/6.23 |
| 2015/0194987 A1 | 7/2015 | Li et al. | |
| 2015/0263767 A1 | 9/2015 | Shin et al. | |
| 2015/0295593 A1* | 10/2015 | Trifonov | H03M 13/13 |
| | | | 714/776 |
| 2016/0013810 A1 | 1/2016 | Gross et al. | |
| 2016/0204811 A1* | 7/2016 | Goela | H04B 7/0413 |
| | | | 375/260 |
| 2016/0241258 A1 | 8/2016 | Zeng et al. | |
| 2018/0198560 A1* | 7/2018 | Jiang | H03M 13/29 |
| 2018/0226999 A1* | 8/2018 | Wang | H03M 13/3784 |
| 2018/0367250 A1 | 12/2018 | Li et al. | |
| 2019/0165813 A1 | 5/2019 | Liu et al. | |
| 2020/0007162 A1 | 1/2020 | Zhang et al. | |
| 2020/0036476 A1* | 1/2020 | Yang | H04L 1/0014 |

OTHER PUBLICATIONS

Translation of the Written Opinion of the International Searching Authority of International Application No. PCT/CN2018/077852, International Searching Authority, State Intellectual Property Office of the P.R. of China, Beijing, China, pp. 1-4, dated Mar. 6, 2019. (Year: 2019).*

Mediatek Inc: "Examination of NR Coding Candidates for Low-Rate Applications", 3GPP draft R1-167871, RAN WG1, Gothenburg, Sweden; XP051142643, 16 pages.

Huawei:"Construction schemes for polar codes", 3GPP draft R1-1701702, RAN WG1, Athens, Greece; XP051208868, 8 pages.

Huawei:"Polar code design and rate matching", 3GPP draft R1-167209, RAN WG1, Gothenburg, Sweden; XP051142532, 6 pages.

Qualcomm Inc: "Polar code information bit allocation and nested extension construction", 3GPP draft R1-1702646, RAN WG1, Athens, Greece; XP051209795, 14 pages.

* cited by examiner 1 2 3 5 4 6 7 8

METHOD, APPARATUS, AND DEVICE FOR DETERMINING POLAR CODE ENCODING AND DECODING

CROSS-REFERENCE TO RELATED APPLICATIONS

This application is a continuation of International Application No. PCT/CN2018/077852, filed on Mar. 2, 2018, which claims priority to Chinese Patent Application No. 201710121684.4, filed on Mar. 2, 2017. The disclosures of the aforementioned applications are hereby incorporated by reference in their entireties.

TECHNICAL FIELD

The present invention relates to the field of channel coding and decoding in a communications system, and more specifically, to a polar encoding or decoding method, apparatus, and device.

BACKGROUND

In a communications system, channel coding is usually used to improve data transmission reliability and ensure communication quality. A polar (Polar) code is a coding scheme that can achieve a Shannon capacity as proved in theory and that has a simple encoding and decoding method. The polar code is a linear block code. A generation matrix of the polar code is $G_N$, and an encoding process of the polar code is $x_1^N = u_1^N$, where $u_1^N = (u_1, u_2, \ldots, u_N)$ is a binary row vector, $G_N = F_2^{\otimes(log_2(N))}$, a code length $N=2^n$, n is a positive integer, $$F_2 = \begin{bmatrix} 1 & 0 \\ 1 & 1 \end{bmatrix},$$

$F_2^{\lfloor(log_2(N))\rfloor}$ is a Kronecker product of $F_2$, and it is defined that $F_2^{\lfloor(log_2(N))\rfloor} = F \lfloor F_2^{\lfloor(log_2(N))\rfloor-1}$.

In the polar code encoding process, some bits in $u_1^N$ are used to carry information, and are referred to as information bits. A set of sequence numbers of these information bits is denoted as A. Other bits are set to fixed values that are pre-agreed on by a transmit end and a receive end, and are referred to as fixed bits. A set of sequence numbers of these fixed bits is represented by a complementary set $A^c$ of A. Without loss of generality, these fixed bits are usually set to 0. Actually, a fixed bit sequence can be randomly set, provided that the transmit end and the receive end agree. Therefore, an encoded bit sequence of the polar code can be obtained by using the following method: $x_1^N = u_A G_N(A)$, where $u_A$ is a set of information bits in $u_1^N$, and $u_A$ is a row vector having a length of K, to be specific, $|A|=K$, and $|\cdot|$ indicates a quantity of elements in a set, in other words, K indicates a quantity of elements in the set A, $G_N(A)$ is a submatrix obtained by using rows corresponding to indexes in the set A in the matrix $G_N$, and $G_N(A)$ is a K×N matrix.

A key to polar code encoding is determining of the code length N and the information bit set A. In an existing polar code encoding solution, the information bit set A cannot be determined through simple calculation, and the information bit set A may further include a check bit or another bit that facilitates decoding. In the prior art, in most cases, an offline computation and storage manner is adopted for determining. To be specific, an encoder and a decoder prestore a table of correspondences between a plurality of mother code sequences and code lengths and code rates. When polar code encoding is performed, a corresponding mother code sequence is selected from the table based on a required code rate and code length.

In the prior art, to support all combinations of code lengths and code rates required by a system, a large quantity of mother code sequences need to be stored. Consequently, storage overheads of the system are very high.

SUMMARY

This application provides a polar encoding method, apparatus, and device to reduce storage overheads of a system.

According to a first aspect, a polar code encoding and decoding method in a communications system is provided. The method includes: obtaining a basic quantized sequence, where the basic quantized sequence includes a quantized value used to represent reliability corresponding to a polarized subchannel; obtaining a target quantized sequence based on the basic quantized sequence, where a relative magnitude relationship between elements in the target quantized sequence is nested with a relative magnitude relationship between elements in the basic quantized sequence; determining K largest quantized values in the target quantized sequence based on a non-fixed bit length K, and using polarized subchannels corresponding to the K largest quantized values, as a non-fixed bit position set; and performing polar code encoding or decoding based on the non-fixed bit position set. According to a second aspect, this application provides a polar encoding apparatus, configured to perform the method according to any one of the first aspect or possible implementations of the first aspect. Specifically, the apparatus includes units configured to perform the method according to any one of the first aspect or possible implementations of the first aspect.

According to a second aspect, a polar code encoding and decoding apparatus in a communications system is provided. The apparatus includes a polar code structure determining module and at least one of polar code encoding and decoding modules, where the polar code structure determining module is configured to: obtain a basic quantized sequence, where the basic quantized sequence includes a quantized value used to represent reliability corresponding to a polarized subchannel; obtain a target quantized sequence based on the basic quantized sequence, where a relative magnitude relationship between elements in the target quantized sequence is nested with a relative magnitude relationship between elements in the basic quantized sequence; and determine K largest quantized values in the target quantized sequence based on a non-fixed bit length K, and use polarized subchannels corresponding to the K largest quantized values, as a non-fixed bit position set; the polar code encoding module is configured to perform polar code encoding based on the non-fixed bit position set determined by the polar code structure determining module (201, 502); and the polar code decoding module is configured to perform polar code decoding based on the non-fixed bit position set determined by the polar code structure determining module.

According to a third aspect, this application provides a polar code encoding and decoding apparatus in a communications system. Specifically, the apparatus includes a memory and a processor. The memory is connected to the processor by using a bus system. The memory is configured to store an instruction. The processor is configured to execute the instruction stored in the memory, and when the instruction is executed, the processor performs the method according to any one of the first aspect or possible implementations of the first aspect.

According to a fourth aspect, this application provides a computer-readable medium, configured to store a computer program. The computer program includes an instruction for performing the method according to any one of the first aspect or possible implementations of the first aspect.

In embodiments of the present invention, a system obtains a target quantized sequence based on a basic quantized sequence of a polar code, and then obtains a non-fixed bit position set based on the target quantized sequence, to facilitate polar code encoding or polar code decoding. This can reduce storage overheads of the system.

DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may derive other accompanying drawings from these accompanying drawings without creative efforts.

FIG. 4 shows a specific example in an expansion rule;

FIG. 4a shows a specific example in another expansion rule;

DESCRIPTION OF EMBODIMENTS

Figure 1:
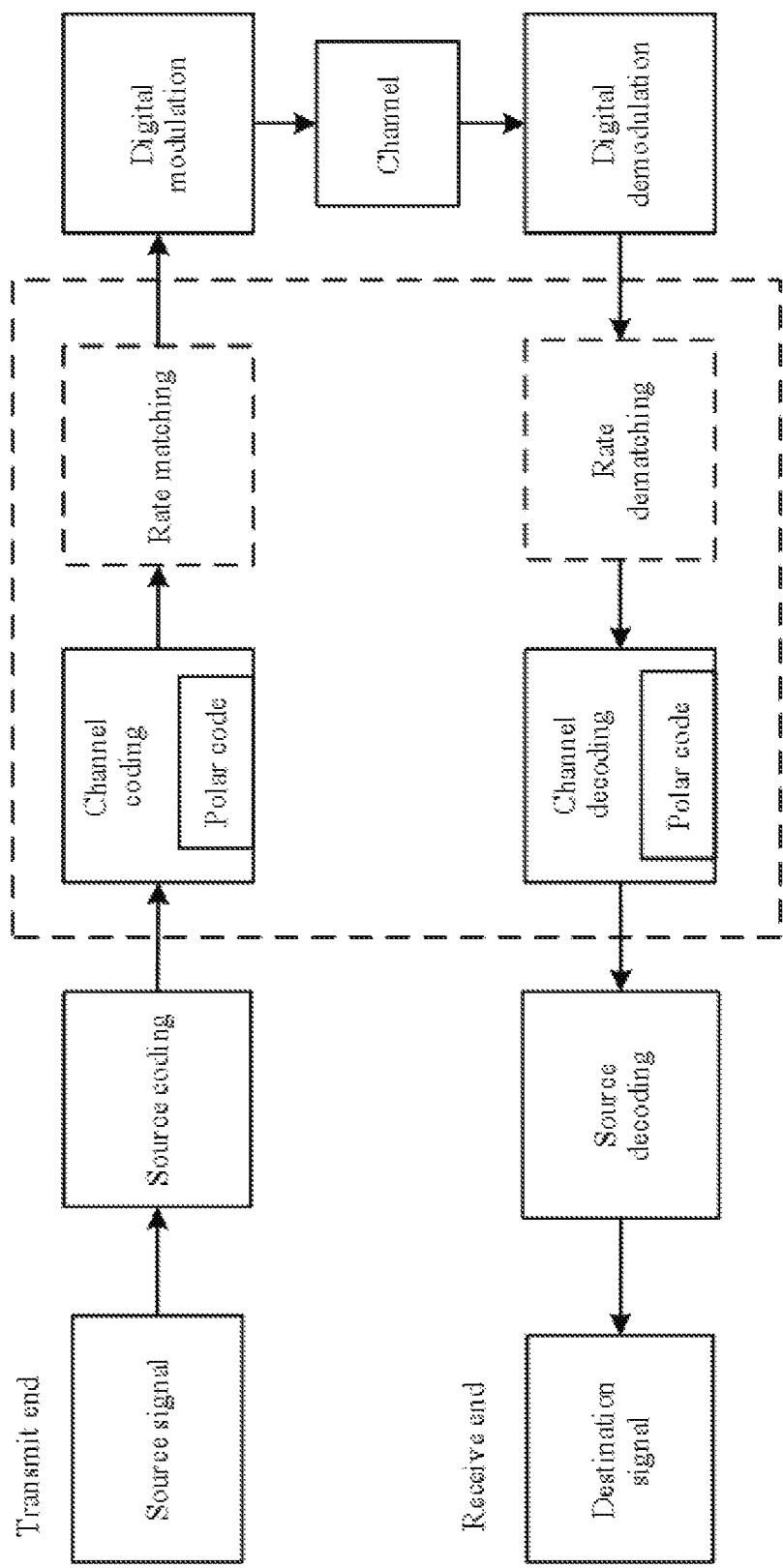
FIG. 1 is a flowchart of a system environment to which polar encoding and decoding are applied according to an embodiment of the present invention.

The following clearly and completely describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

The embodiments of the present invention may be applied to various communications systems, such as a global system for mobile communications (Global System of Mobile Communication, GSM) system, a code division multiple access (Code Division Multiple Access, CDMA) system, a wideband code division multiple access (Wideband Code Division Multiple Access. WCDMA) system, a general packet radio service (General Packet Radio Service, GPRS) system, a long term evolution (Long Term Evolution, LTE) system, an LTE frequency division duplex (Frequency Division Duplex, FDD) system, an LTE time division duplex (Time Division Duplex, TDD) system, a universal mobile telecommunications system (Universal Mobile Telecommunications System, UMTS), or the like. In the foregoing system, information or data encoded by a base station or a terminal in the foregoing system by using a conventional Turbo code or LDPC code may all be encoded by using a polar code in the embodiments.

The base station may be a device configured to communicate with a terminal device. For example, the base station may be a base transceiver station (Base Transceiver Station, BTS) in the GSM or the CDMA system, or may be a NodeB (NodeB, NB) in the WCDMA system, or may be an evolved NodeB (evolved NodeB, eNB or eNodeB) in the LTE system. Alternatively, the base station may be a relay node, an access point, an in-vehicle device, a wearable device, a network side device in a future 5G network, or the like. The base station may be alternatively a terminal that functions as a base station in device-to-device (Device-to-Device, D2D) communication.

The terminal may communicate with one or more core networks by using a radio access network (Radio Access Network, RAN). The terminal may be user equipment (User Equipment, UE), an access terminal, a subscriber unit, a subscriber station, a mobile station, a mobile console, a remote station, a remote terminal, a mobile device, a user terminal, a wireless communications device, a user agent, a user apparatus, or the like. The access terminal may be a cellular phone, a cordless phone, a session initiation protocol (Session Initiation Protocol, SIP) phone, a wireless local loop (Wireless Local Loop, WLL) station, a personal digital assistant (Personal Digital Assistant, PDA), a handheld device having a wireless communication function, a computing device, another processing device connected to a wireless modem, an in-vehicle device, a wearable device, a terminal device in the future 5G network, or the like.

For ease of understanding, a method 100 for polar encoding in an embodiment of the present invention is described in detail below with reference to FIG. 1 to FIG. 5.

FIG. 1 shows a processing procedure on a physical layer in a wireless communications system. On a transmit end, a source signal experiences source coding, and channel coding, or rate matching, and digital modulation, and is then sent to a receive end through a channel. On the receive end, digital demodulation, rate dematching, channel decoding, and source decoding are performed on the signal received through the channel, to obtain a destination signal.

This example implementation relates to channel coding and channel decoding. The channel coding is used to increase redundancy and improve robustness of an information flow during channel transmission. Usually, a channel coding scheme may be a Turbo code, a polar (or referred to as Polar) code, or a low-density parity-check code (Low-density Parity-check Code, LDPC code for short). This implementation mainly focuses on a channel coding method using a polar code and a corresponding decoding method and apparatus that may be applied to various communications systems, including a communications system capable of supporting at least two coding and decoding schemes. Details are not described herein.

Figure 1A:
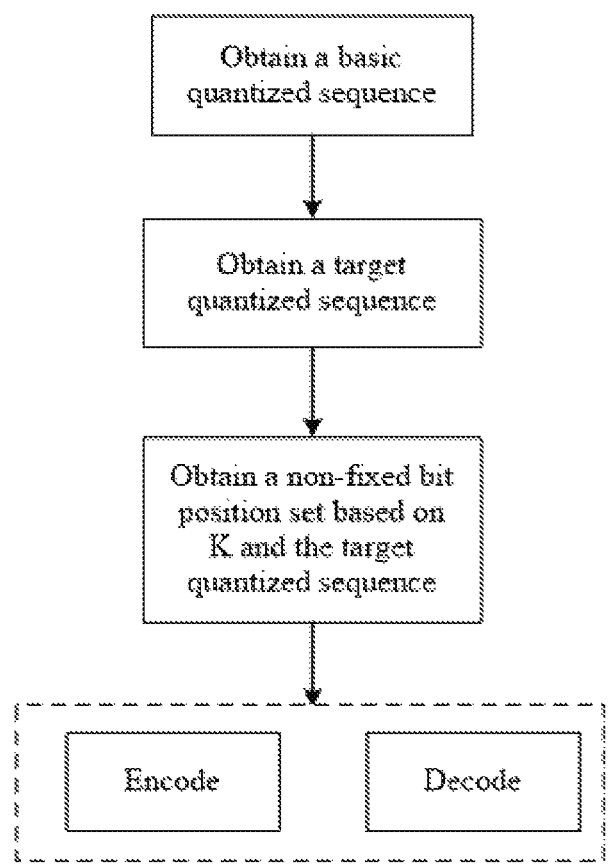
FIG. 1a is a schematic flowchart of a method described in FIG. 1.

FIG. 1a generally shows a polar code encoding and decoding method in a communications system.

101. Obtain a basic quantized sequence, where the basic quantized sequence includes a quantized value used to represent reliability corresponding to a polarized subchannel.

The polarized subchannel is a subchannel for polar code encoding or decoding, and may be indicated by information such as a sequence number or an index.

The quantized value used to represent the reliability corresponding to the polarized subchannel may be a quantized value of the reliability or a quantized value of unreliability, provided that a relative magnitude of the reliability corresponding to the polarized subchannel can be reflected.

102. Obtain a target quantized sequence based on the basic quantized sequence, where a relative magnitude relationship between elements in the target quantized sequence is nested with a relative magnitude relationship between elements in the basic quantized sequence.

The element included in the basic quantized sequence or the target quantized sequence is the quantized value used to represent the reliability corresponding to the polarized subchannel. Specifically, quantized values can indicate a mutual magnitude relationship between reliability corresponding to various polarized subchannels. Precision is 1 or another value.

The nesting means that a magnitude relationship between elements in a basic quantized sequence $N_0$ is consistent with a magnitude relationship between elements of corresponding polarized subchannels in a target quantized sequence N.

In addition, if the target quantized sequence is obtained by expanding the basic quantized sequence, the magnitude relationship between the elements in the basic quantized sequence $N_0$ is further consistent with a magnitude relationship between corresponding elements in the expanded part of the target quantized sequence. For example, in an $i^{th}$ round of expansion, a basic quantized sequence of a length $iN_0$ is expanded into a sequence of a length $2iN_0$. The nesting means that a magnitude relationship between quantized values corresponding to polarized subchannels with sequence numbers 1 to $iN_0$ is consistent with a magnitude relationship between quantized values in the basic quantized sequence of the length $iN_0$; and a magnitude relationship between quantized values corresponding to the polarized subchannels with the sequence numbers 1 to $iN_0$ is consistent with a magnitude relationship between quantized values corresponding to polarized subchannel sequence numbers with sequence numbers $iN_0+1$ to $2iN_0$.

If the target quantized sequence is obtained by extracting a part from the basic quantized sequence, the magnitude relationship between the elements in the target quantized sequence is consistent with a magnitude relationship between elements in the extracted part from the basic quantized sequence. For example, the basic quantized sequence is $Z_1^{16}=[1, 2, 3, 6, 4, 7, 8, 12, 5, 9, 10, 13, 11, 14, 15, 16]$, and the elements in the extracted part are [1, 2, 3, 6, 4, 7, 8, 12]. The target quantized sequence is determined as $Z_1^8=[1, 2, 3, 5, 4, 6, 7, 8]$ based on elements {1, 2, 3, 4, 5, 6, 7, 8} (having no sorting relationship) that are required to be included in the target quantized sequence and a relative magnitude relationship in [1, 2, 3, 6, 4, 7, 8, 12].

103. Determine K largest quantized values in the current to-be-encoded target quantized sequence based on a non-fixed bit length K. and use polarized subchannels corresponding to the K quantized values, as a non-fixed bit position set.

A non-fixed bit is a bit sequence excluding a fixed bit during polar code encoding and decoding, includes an information bit, and In some embodiments, may further include a bit for check, a bit for assisting decoding, and the like. A non-fixed information position is a subchannel that inputs or outputs non-fixed information during the polar code encoding and decoding, and may be indicated by information such as a sequence number or an index. An element in the non-fixed bit position set is the non-fixed information position that is also referred to as a polarized subchannel.

104: Perform polar code encoding or decoding based on the non-fixed bit position set.

When the method is applied to an encoding side, the polar code encoding based on the non-fixed bit position set includes: performing the polar code encoding based on a to-be-encoded non-fixed bit sequence and the non-fixed bit position set to obtain an encoded bit. In other words, the to-be-encoded non-fixed bit sequence is used as input of the non-fixed bit position set for performing the polar code encoding, to obtain the encoded bit. A method for constructing or generating the non-fixed bit sequence is not limited in this specification.

When the method is applied to a decoding side, the performing polar code decoding based on the non-fixed bit position set includes:

performing the polar code decoding based on a to-be-decoded bit sequence obtained after rate matching and the non-fixed bit position set to obtain a decoded non-fixed bit sequence. A specific decoding process or method is not limited in this specification.

Figure 2:
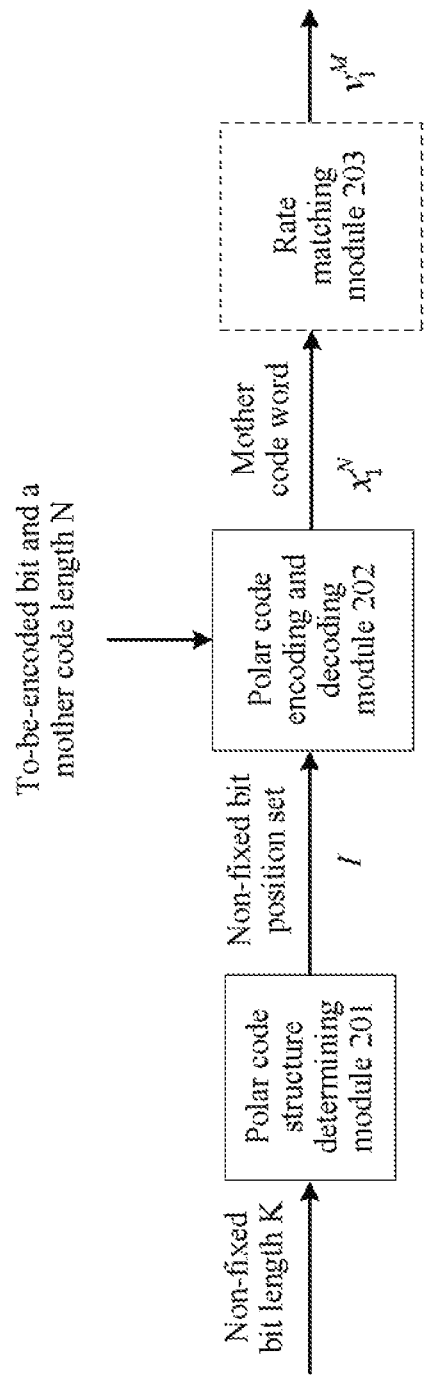
FIG. 2 is a schematic diagram of a structure and an operating principle of an apparatus on an encoding side according to an embodiment of the present invention.
Figure 5:
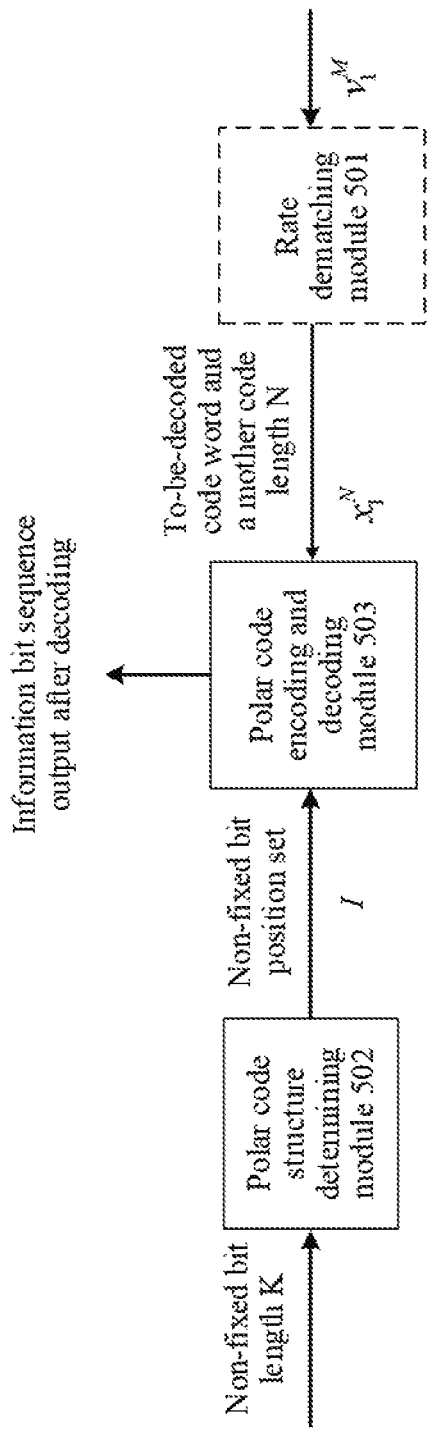
FIG. 5 is a schematic diagram of a structure and an operating principle of an apparatus on a decoding side according to an embodiment of the present invention.

For details, refer to the following FIG. 2 and FIG. 5 and descriptions thereof. The details are not described in this specification.

For ease of understanding, definitions of the foregoing symbols and symbols that may be used subsequently are described as follows:

K: a non-fixed bit length. Non-fixed bits include an information bit, and In some embodiments further include a check bit, a bit for assisting decoding, and the like.

N: a target quantized sequence, or referred to as a mother code length of a polar code (that is an integer power of 2).

M: a target code length (on the encoding side, M is a code length of a subsequently sent sequence, and if rate matching is required after polar encoding, M is a code length obtained after rate matching is performed on a mother code length N of a polar code: on the decoding side, M is an originally received code length, and a length N of a target quantized sequence is obtained after rate dematching).

I: a non-fixed information position set (a set of polarized subchannels that inputs or outputs non-fixed information).

Q: a sequence of sequence numbers of subchannels obtained through sorting in ascending order of polarization weights or reliability, which is referred to as a sorting sequence for short.

Z: a reliability sequence obtained by quantizing reliability corresponding to polarized subchannels at a precision of 1, which is referred to as a quantized sequence for short.

$W_1^N$: magnitudes of reliability of polarized subchannels 1 to N.

Wi: a magnitude of reliability of an $i^{th}$ polarized subchannel.

The encoding side is used as an example below first to describe an implementation the present invention. FIG. 2 is a schematic diagram of an operating principle of a polar code encoding method and apparatus in a communications system. The following is included.

A polar code structure determining module 201 in FIG. 2 is configured to: generate or obtain a target quantized sequence, and determine a non-fixed bit position set I based on a non-fixed bit length K and the target quantized sequence. Specifically, the following is included.

S201. Obtain the target quantized sequence by expanding or extracting a part from (or perform sequential selection in) a basic quantized sequence known to the system. Regardless of expansion or part extraction, a relative magnitude relationship between elements in the target quantized sequence is nested with a relative magnitude relationship between elements in the basic quantized sequence.

The foregoing polarized subchannel may be uniquely indicated by a sequence number or an index or in another manner. Details are not described herein.

In some embodiments, when a length N of the target quantized sequence is greater than a length of the basic quantized sequence, the basic quantized sequence is expanded according to an expansion rule to obtain the target quantized sequence. The nesting means that the magnitude relationship between the elements in the basic quantized sequence is consistent with a magnitude relationship between corresponding elements included in the target quantized sequence of the length N. In some embodiments, if the length of the target quantized sequence is less than or equal to the length of the basic quantized sequence, sequential selection is performed in the basic quantized sequence in a front-to-back or back-to-front order to obtain the target quantized sequence.

S202. Determine the non-fixed bit position set I based on the non-fixed bit length K and the target quantized sequence. In some embodiments, K largest quantized values are selected from the target quantized sequence based on quantized values of reliability. Polarized subchannels corresponding to the K selected quantized values are the non-fixed bit position set.

In some embodiments, a threshold may be set for a quantized value of reliability, and the non-fixed bit position set is determined in parallel based on the threshold. For example, each element in the target quantized sequence is compared with the threshold in parallel, and the non-fixed bit position set is determined based on a relationship with the threshold. For example, an element satisfying that a difference between the element and the threshold is greater than or equal to 0 or 1, or that a ratio of the element to the threshold is greater than or equal to 1, or the like belongs to the non-fixed bit position set.

On one hand, if rate matching is not required subsequently (that is, M=N), for the target quantized sequence that is quantized at a precision of 1, when a smallest value in the target quantized sequence is 1, a position of an element that is greater than or equal to (N−K+1) in $Z_1^N$ may be selected in parallel as the non-fixed bit position set I. Alternatively, when a smallest value in the target quantized sequence is 0, a position of an element that is greater than or equal to (N−K) in $Z_0^N$ may be selected in parallel as the non-fixed bit position set I.

Equivalent to the foregoing example, for the target quantized sequence of the length N, when the smallest value in the target quantized sequence is 1, (N−K) may be used as the threshold. An element (namely, a polarized subchannel that may be indicated by a sequence number or an index) whose difference from (N−K) is greater than 1 in the target quantized sequence is determined as the non-fixed bit position set. If the smallest value in the target quantized sequence is 0, and (N−K) is also used as the threshold, an element whose difference from (N−K) is greater than 0 in the target quantized sequence is used as the non-fixed bit position set.

On the other hand, when rate matching is required, for example, when M<N, positions corresponding to K largest elements other than a puncturing position in the target quantized sequence $Z_1^N$ are selected as the non-fixed bit position set I. In addition to excluding the puncturing position, the non-fixed bit position set I may be further determined in parallel in a manner similar to the manner of setting a threshold. Specifically, preferably, a position with lower reliability is selected as the puncturing position, for example, polarized subchannels corresponding to (N−M) smallest elements in the target quantized sequence are used as puncturing positions for puncturing. In this case, the foregoing specific solution of selecting the K largest elements from the target quantized sequence as the non-fixed bit position set is not affected. Specifically, preferably, a position with higher reliability is selected as the puncturing position, for example, polarized subchannels corresponding to (N−M) largest elements in the target quantized sequence are used as puncturing positions for puncturing. In this case, the K largest elements other than the puncturing position, that is, positions corresponding to elements that are greater than or equal to a threshold M−K+1, are selected from the target quantized sequence as the non-fixed bit position set.

In addition, when M is greater than N, no puncturing needs to be performed on N, and subsequent rate matching does not affect the foregoing process of determining the non-fixed bit position set. In other words, in this case, the foregoing implementation when M=N may also be used: the non-fixed bit position set is determined in parallel by setting a threshold.

S203. A polar code encoding module 202 performs polar code encoding based on a to-be-encoded non-fixed bit and the non-fixed bit position set I to obtain an encoded bit.

S204. In some embodiments, a rate matching module performs rate matching based on a target code length M.

A to-be-encoded bit is used as an information bit of a polar code. In some embodiments, a check bit or another non-fixed bit is used as input of a polarized subchannel in the non-fixed bit position set I, a known fixed bit (or a frozen bit) is used as input of another polarized subchannel, and the encoded bit is obtained according to the polar code encoding method described above. The encoded bit is also referred to as a mother code word.

It should be noted that, the foregoing quantized value is also referred to as a quantized value or a metric, and essential content thereof is not affected by different names. A quantized sequence is different from a sorting sequence of polarized subchannels. The sorting sequence of polarized subchannels includes sorting of priorities of polarized subchannels (that may be identified by sequence numbers) used as information bits in a case of a particular code length. The non-fixed bit position set I is a set of the polarized subchannels (that may be identified by sequence numbers) used as information bits. For the set, there is no concept of priority.

In this example implementation, the basic quantized sequence is expanded to obtain the target quantized sequence, so that the non-fixed bit position set can be simply constructed. For example, during implementation of a product (hardware or a combination of software and hardware), a non-fixed bit position set may be determined in parallel based on a specified quantization threshold. By contrast, in an implementation using a sorting sequence, sequential reading is required and a puncturing position is skipped, to determine a position of an information bit. According to the solution in this implementation, system performance can be maximally improved.

Differences between the quantized sequence, the sorting sequence, and the non-fixed bit position set I are described below by using examples. For example, an example in which N=8 is described as follows:

ordered polarized subchannels: 1, 2, 3, 4, 5, 6, 7, 8;
corresponding reliability magnitude sequence $W_1^8$=[0, 1, 1.1892, 2.1892, 1.4142, 2.4142, 2.6034, 3.6034];
corresponding quantized sequence $Z_1^8$=[1, 2, 3, 5, 4, 6, 7, 8];
sorting sequence $Q_1^8$ of channel sequence numbers=[1, 2, 3, 5, 4, 6, 7, 8]; non-fixed bit position set I={4, 6, 7, 8}.

A sequence of reliability magnitudes of the polarized subchannels, that is, reliability magnitudes sequentially corresponding to the polarized subchannels 1, 2, 3, 4, 5, 6, 7, and 8 (or 0, 1, 2, 3, 4, 5, 6, and 7), is $W_1^8$=[0, 1, 1.1892, 2.1892, 1.4142, 2.4142, 2.6034, 3.6034]. Specifically, a reliability magnitude may be obtained by using a construction algorithm such as density evolution, Gaussian approximation, a Bhattacharvya parameter, or a polarization weight. This is not limited herein.

Values in $W_1^8$ are quantized at the precision of 1 to obtain a quantized sequence $Z_1^8$=[1, 2, 3, 5, 4, 6, 7, 8]. To be specific, relative reliability magnitudes (quantized values) sequentially corresponding to the polarized subchannels 1, 2, 3, 4, 5, 6, 7, and 8 (or 0, 1, 2, 3, 4, 5, 6, and 7) are $Z_1^8$. Certainly, quantization may be alternatively performed in another manner, including: performing quantization at linear and nonlinear precision, or performing quantization in an integer and decimal manner. Details are not described herein. Z may be alternatively represented starting from 0, for example, $Z_1^8$=[0, 1, 2, 4, 3, 5, 6, 7].

The polarized subchannels corresponding to the quantized values are sorted in an ascending order of values of the elements in $W_1^8$ to obtain a sorting sequence $Q_1^8$=[1, 2, 3, 5, 4, 6, 7, 8]. The sorting sequence is used to indicate sequence numbers of channels in descending order of reliability. Q may also be represented starting from 0, to be specific, $Q_1^8$=[0, 1, 2, 4, 3, 5, 6, 7]. Although the quantized sequence and the sorting sequence seem to be consistent in form, they represent different technical meanings, and have different functions during subsequent use.

For example, a quantity K of information bits=4, the non-fixed bit position set I={4, 6, 7, 8} is obtained based on the quantized sequence (or the sorting sequence). In this embodiment, polarized subchannels indicated by the polarized subchannels 4, 6, 7, and 8 are selected as input channels for the information bits.

Figure 3:
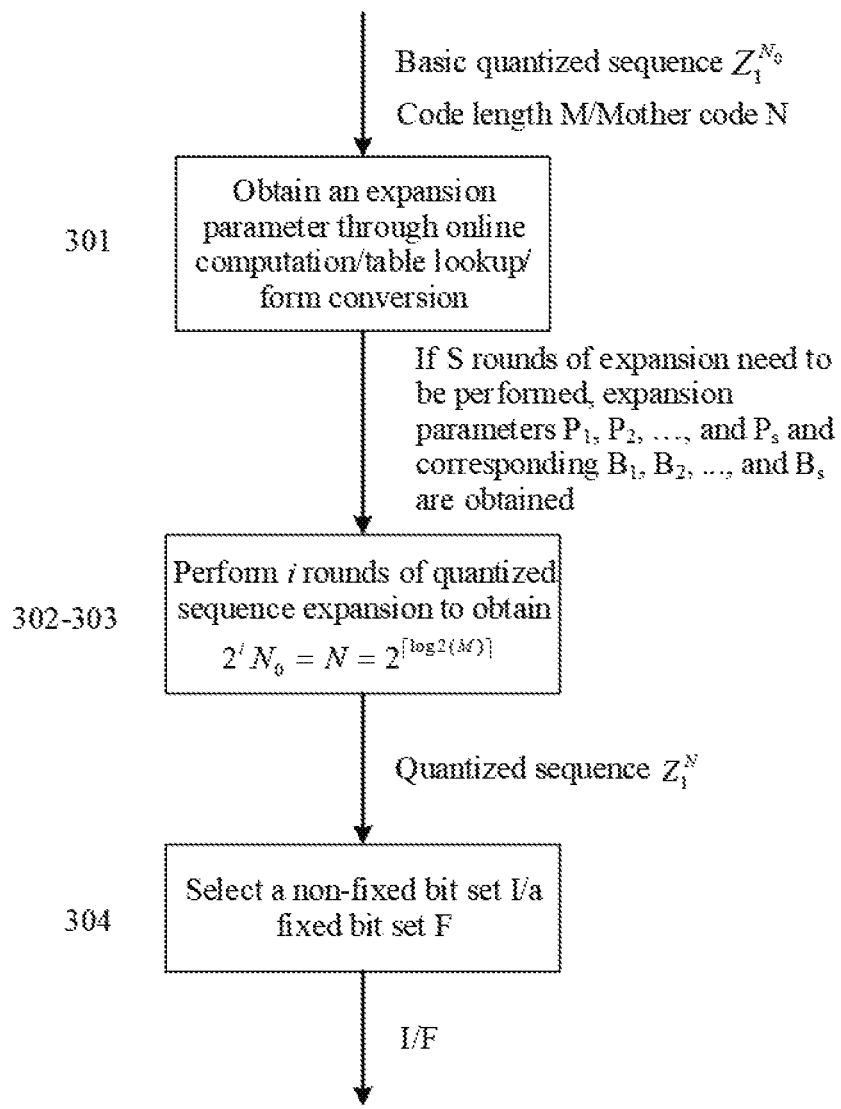
FIG. 3 is a schematic diagram of an algorithm structure of a polar code structure determining module according to an embodiment of the present invention.

An example in which a target quantized sequence is obtained by expanding a basic quantized sequence is used below to describe an implementation of performing polar encoding. Referring to FIG. 3, the method includes:

determining a basic quantized sequence $Z_1^{N_0}$ and an expansion rule (the expansion rule is indicated by an expansion rule parameter).

In some embodiments, a length of the basic quantized sequence is an integer power of 2, and may be a minimum mother code length $N_0$ allowed in a communications system, or may be a length between a maximum mother code length and a minimum mother code length. The minimum mother code length specified in the system is, for example, 8, 16, or 32. The maximum mother code length specified in the system is, for example, 512 or 1024. For example, the length of the basic quantized sequence is 64, and certainly, may be alternatively 128 or 256, or another possible length. Certainly, the system may specify different maximum mother code lengths based on scenarios having different requirements. For example, a maximum code length of downlink control information is 512, and a maximum code length of uplink control information is 1024. The system may use different basic quantized sequences for different scenarios as required, or for simplification, the system may use a same basic quantized sequence. Details are not described in this specification.

The basic quantized sequence may be expanded by using the method in this implementation based on a case agreed on by the system, to obtain a target quantized sequence whose code length is greater than a code length of the basic quantized sequence. For a target quantized sequence whose code length is less than or equal to the code length of the basic quantized sequence, the target quantized sequence may be directly extracted from the basic quantized sequence, and may be obtained in a front-to-back or back-to-front order.

The basic quantized sequence may be determined through online computation. For example, a quantized sequence obtained in a previous round of expansion is used as a new basic quantized sequence. In some other embodiments, the basic quantized sequence may be directly obtained by using a basic quantized sequence stored in the system, or may be obtained by converting a representation manner in another form. A representation manner of the basic quantized sequence includes, but is not limited to, a hexadecimal representation manner, a manner of calculation according to a PW formula, or a binary representation manner.

An expansion parameter may be obtained in a manner such as online computation/table lookup/form conversion. For example, as shown in FIG. 3, if S rounds of expansion need to be performed, expansion parameters $P_1, P_2, \ldots,$ and $P_S$ and corresponding $B_1, B_2, \ldots,$ and $B_S$ are obtained. Parameters for each round are subsequently described in detail.

A quantized sequence $Z_1^{2N_0}$ is obtained after a first round of expansion based on the basic quantized sequence $Z_1^{N_0}$ and the expansion rule (or the expansion rule parameter). The expansion rule is subsequently described in detail.

If required, step 302 is iteratively performed, and $Z_1^{4N_1}$, $Z_1^{8N_1}, \ldots,$ and $Z_1^N$ may be recursively obtained, where N is a final mother code length. To be specific, a quantized sequence $Z_1^{2N_1}$ obtained after the first round of expansion is used as a basic quantized sequence in a next round of expansion, and expansion is performed in a similar expansion manner to obtain the quantized sequence $Z_1^{4N_1}$; or further, the obtained quantized sequence $Z_1^{4N_1}$ may be used as a basic quantized sequence in a next round, and expansion is performed in a similar expansion manner, and so on.

After i rounds of quantized sequence expansion, $2^i N_0 = N = 2^{\lceil log\ 2(M) \rceil}$ is obtained.

304. Determine a non-fixed bit set L/a fixed bit set F based on the determined target quantized sequence N.

A person skilled in the art can understand that determining a non-fixed bit position set and determining a fixed bit position set achieve an equivalent effect. Content in the various implementations can all be correspondingly replaced, and details are not described in this specification. For a specific process, refer to the descriptions of S202. Details are not described herein again.

Figure 3A:
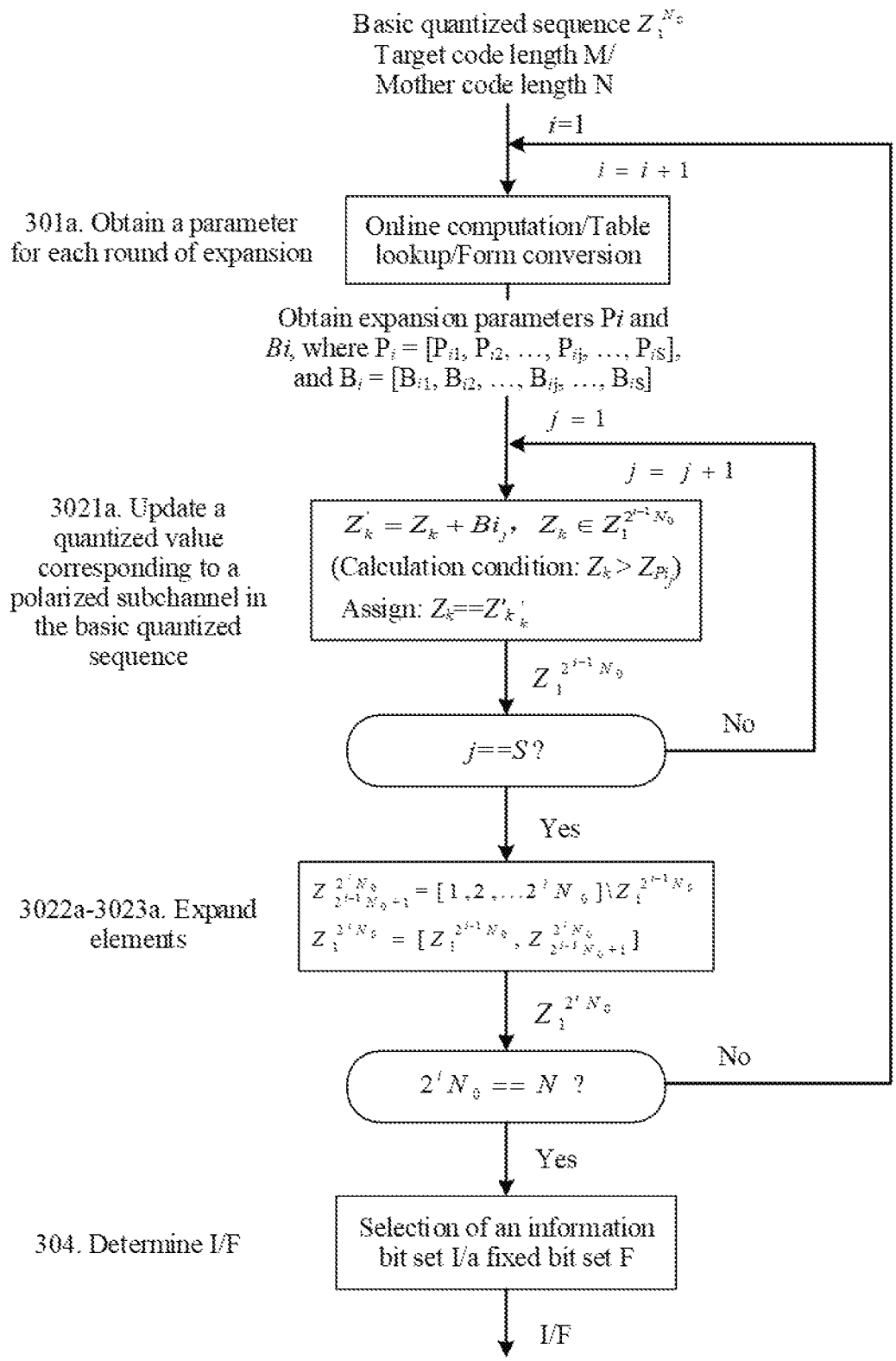
FIG. 3a and FIG. 3b each are a schematic diagram of an algorithm structure of another polar code structure determining module according to an embodiment of the present invention.

FIG. 3a shows an example of a more specific algorithm structure in the expansion rule for the method shown in FIG. 3. It should be noted that, the various implementations of the present invention are not limited to the algorithm structures shown in FIG. 3 and FIG. 3a. Another algorithm structure can be used, provided that related steps can be implemented.

In some embodiments, there are a plurality of expansion rules mentioned in step 302. In general, a relative magnitude of reliability corresponding to an original channel sequence number set remains unchanged after expansion, and a relative magnitude of reliability corresponding to an added channel sequence number set is consistent with the relative magnitude of the reliability corresponding to the original channel sequence number set. The expansion rule may be obtained through online computation, or may be directly obtained by using a stored rule, or may be obtained by converting a representation manner in another form. Expansion rules include, but are not limited to, the following.

Expansion Rule 1:

In short, referring to FIG. 3a, expansion is performed based on parameters $P_i=[P_{i1}, P_{i2}, \ldots, P_{ij}, \ldots, P_{iS}]$ and $B_i=[B_{i1}, B_{i2}, \ldots, B_{ij}, \ldots, B_{iS}]$. An element group including $P_{ij}$ in $P_i$ and $B_{ij}$ in $B_i$ is used to indicate that $B_{ij}$ polarized subchannels (elements) are inserted after a subchannel whose quantized reliability value is $P_{ij}$ in a basic quantized sequence in this round of expansion, where i is a natural number starting from 1, i represents a current round of expansion, j is a natural number ranging from 1 to S, and S is a quantity of polarized subchannel positions that need to be inserted in an $i^{th}$ round of expansion.

In other words, during the first round of expansion, the expansion is performed according to a rule defined by parameters $P_1=[P_{11}, P_{12}, \ldots, P_{1j}, \ldots, P_{1S}]$ and $B_1=[B_{11}, B_{12}, \ldots, B_{1j}, \ldots, B_{1S}]$. Each element group that includes $P_{1j}$ and $B_{1j}$ located at a same position in $P_1$ and $B_1$ is used to indicate that quantized values (elements in a quantized sequence) corresponding to $B_{1j}$ polarized subchannels are inserted after a channel whose quantized reliability value is $P_{1j}$ in the basic quantized sequence, where j and S are natural numbers, and j is a natural number ranging from 1 to S.

If a next round of expansion is required, similar expansion may be performed based on the expanded quantized sequence (used as a new basic quantized sequence) and a parameter $P_2$ and a corresponding parameter $B_2$, where the parameter $P_2=[P_{21}, P_{22}, \ldots, P_{2j}, \ldots, P_{2S}]$ and the corresponding parameter $B_2=[B_{21}, B_{22}, \ldots, B_{2j}, \ldots, B_{2S}]$, and each element group that includes $P_{2i}$ and $B_{2j}$ located at a same position in $P_2$ and $B_2$ is used to indicate that $B_{2i}$ elements are inserted after a channel whose quantized reliability value is $P_{2i}$ in the basic quantized sequence, where S is a natural number, and i is a natural number ranging from 1 to S.

Referring to FIG. 3a, 3021a. Obtain, according to the following formula:

$$Z'_k = Z_k + Bi_j, Z_k \in Z_1^{2^{i-1}N_0}$$

(Calculation condition: $Z_k > Z_{Pi_j}$

Assign: $Z_k = Z'_k$, an updated value of a quantized value corresponding to a same polarized subchannel in a currently expanded quantized sequence $Z_k$ and in the basic quantized sequence.

In some embodiments, the following is included: determining an element $Z_{P1_1}$ at a position $P1_1$ in $Z_1^{N_1}$, and updating an element that is greater than or equal to $Z_{P1_1}+1$ in $Z_1^{N_1}$ to $Z_i+1+B1_1$. An element that is less than $Z_{P1_1}+1$ is not updated. In addition. $Z_1^{N_1}$ is updated for a plurality of times in a same manner until all elements in P1 or B1 are traversed, and $Z'_1^{N_1}$ is obtained after the update is completed. If no element that is greater than or equal to $Z_{P1_1}+1$ exists in $Z_1^{N_1}$ in an update process, a next round of update is directly performed.

For example, FIG. 4 shows an update example of expanding $Z_1^8$ into $N_1^{16} \cdot Z_1^8 = [1,2,3,5,4,6,7,8]$, $P1=[5,7,8]$, and $B1=[1,3,4]$ are input. Output obtained after calculation is $Z'_1^8=[1,2,3,6,4,7,8,12]$.

Referring to FIG. 3a, 3022a and 3023a. Obtain, by using the following formula:

$$Z_{2^{i-1}N_0+1}^{2^i N_0} = [1, 2, \ldots 2^i N_0] \backslash Z_1^{2^{i-1}N_0}$$

$Z_1^{2^i N_0} = [Z_1^{2^{i-1}N_0}, Z_{2^{i-1}N_0+1}^{2^i N_0}]$, an expanded target quantized sequence N through a required quantity of rounds of expansion.

Specifically, the algorithm includes the following steps.

3022a. Obtain a difference set $\{Z_{2N_1+1}^{2N_1}\}$ of the foregoing two element sets according to the following formula: $\{1, 2, \ldots, 2N1\}/\{Z'_1^{N_1}\}$, where each element is merely a metric, and there is no concept of sorting.

For example, referring to FIG. 4, based on a set $\{1, 2, 3, 4, 5, 6, 7, 8, 9, 10, 11, 12, 13, 14, 15, 16\}$ of elements required in $N_1^{16}$ and a set $\{1, 2, 3, 6, 4, 7, 8, 12\}$ of elements in $Z'_1^8$, a difference $\{Z_9^{16}\}=\{5, 9, 10, 11, 13, 14, 15, 16\}$ of the two element sets is obtained.

3023a. Sort elements in the set $\{_{2N_1+1}^{2N_1}\}$ based on relative magnitudes and positions similar to relative magnitudes and positions of elements in $Z'_1^{N_1}$, to obtain final required $Z_{2N_1+1}^{2N_1}$.

As shown in FIG. 4, $\{Z_9^{16}\}$ is sorted based on relative magnitudes of elements in $Z'_1^8=[1, 2, 3, 6, 4, 7, 8, 12]$, to obtain $Z_9^{16}=[5, 9, 10, 13, 11, 14, 15, 16]$.

In this way, a quantized sequence, namely, $Z_1^{16}=[1, 2, 3, 6, 4, 7, 8, 12, 5, 9, 10, 13, 11, 14, 15, 16]$, is obtained after the first round of expansion through the foregoing expansion.

The foregoing expansion method is circularly used based on a length of the target quantized sequence. A quantized sequence obtained after each round of expansion is used as a basic quantized sequence for a next round of expansion. Expansion is performed according to an expansion rule for a current round of expansion, to obtain the target quantized sequence.

In the foregoing solution, it may be understood from a perspective of a result that, expansion is performed according to an expansion rule for a corresponding sorting sequence Q:

$P_1=[P_{11}, P_{12}, P_{1i}, \ldots, P_{1s}]$ and $B_1=[B_{11}, B_{12}, \ldots, B_{1i}, \ldots, B_{1s}]$ indicate that $B1_i$ elements ($B1_i$ elements at consecutive positions in $Q_{1N_1+1}^{2N_1}$) are inserted between a $P_{1j}^{th}$ position and a $P_{1(i+1)}^{th}$ position in an original sorting sequence $Q_1^{N_1}$.

For example, for the example in FIG. 4, an original sorting sequence $Q_1^8=[1, 2, 3, 5, 4, 6, 7, 8]$ is expanded based on P1=[5, 7, 8] and B1=[1, 3, 4] into:

1 2 3 5 4 6 7 8
⇩
1 2 3 5 9 4 6 7 10 11 13 8 12 14 15 16.

However, if the method of expansion based on a sorting sequence is used, information element positions need to be sequentially determined for a finally generated sorting sequence. In the various implementations of the present invention, information bit positions can be determined in parallel based on the determined target quantized sequence, thereby improving overall performance of an encoding process.

Expansion Rule 2:

Expansion is performed based on an expansion parameter $D_i=[D_{i1}, D_{i2}, \ldots, D_{ik}, \ldots, D_{iR}]$, where an element $D_{ik}$ in $D_i$ is used to indicate a change relative to a quantized value on a $k^{th}$ polarized subchannel in the basic quantized sequence, i is a natural number starting from 1, i represents a current round of expansion, k is a sequence number of the polarized subchannel, and R equals to a length of the basic quantized sequence during an $i^{th}$ round of expansion.

The following is included. A first round of expansion is performed based on an expansion parameter sequence $D_1 = [D_{11}, D_{12}, \ldots D_{1k}, \ldots, P_{1R}]$, where an element $D_{1j}$ is used to indicate a change magnitude (or referred to as an increment or the like) relative to the quantized value on the $k^{th}$ polarized subchannel in the basic quantized sequence during the first round of expansion, i and R are natural numbers, k is a natural number ranging from 1 to R, and the length R herein is equal to a length of a current basic quantized sequence. If a next round of expansion is required, similar expansion may be performed based on the expanded quantized sequence (used as a new basic quantized sequence) and a parameter $D_2 = [D_{21}, D_{22}, \ldots D_{2k}, \ldots, P_{2\ 2R}]$.

Figure 3B:
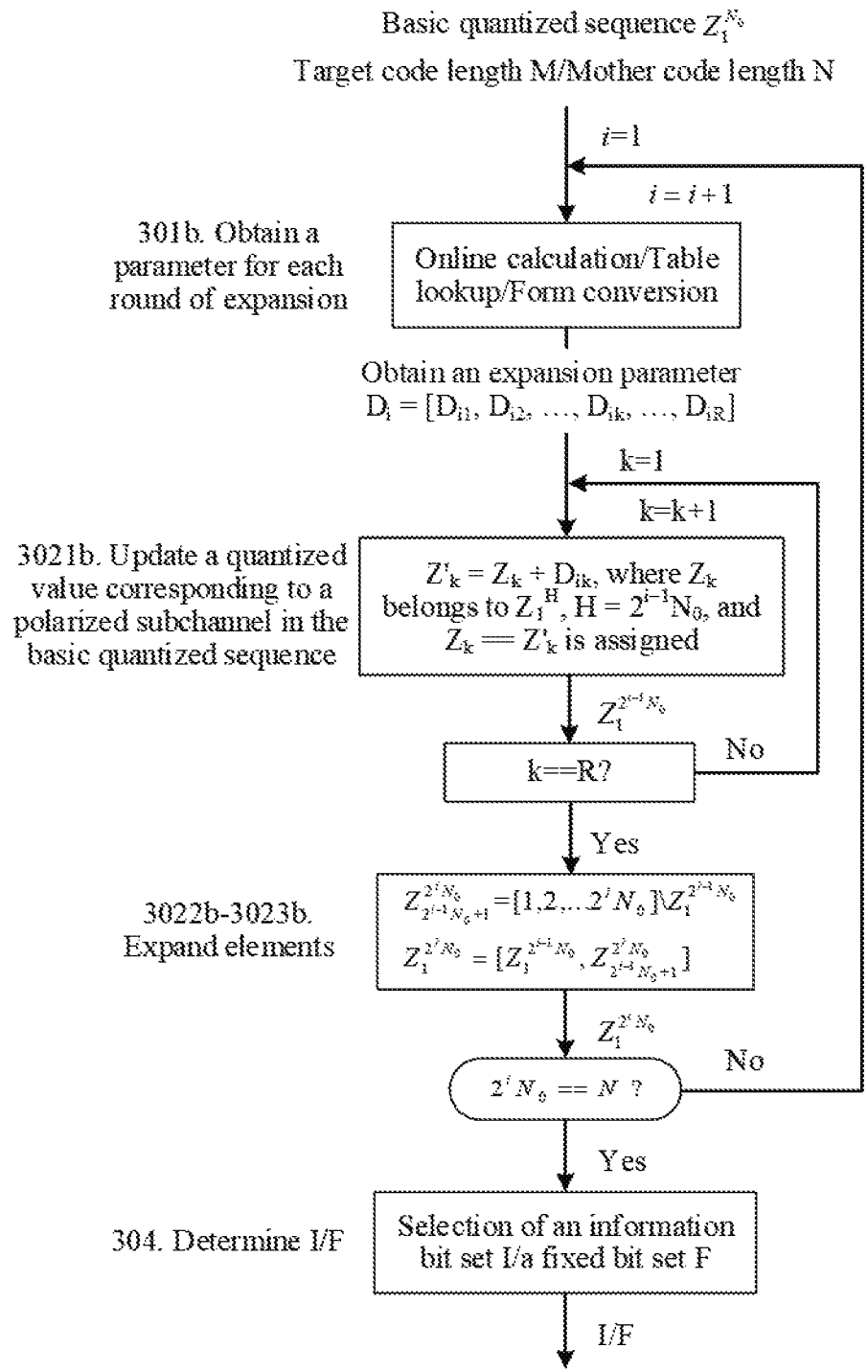

Referring to FIG. 3b, the method includes the following steps.

3021b. Update, based on the foregoing expansion parameter $D_i = [D_{i1}, D_{i2}, \ldots, D_{ik}, \ldots, D_{iR}]$, a quantized value $Z_k$ corresponding to a polarized subchannel in the current basic quantized sequence $N_0$. An updated value $Z_k = Z_k + D_{ik}$, $Z_k$ belongs to $Z_1^H$, $H = 2^{i-1} N_0$, and $Z_k = Z_k$ is assigned.

The following is included: During the first round of expansion, elements $[Z_1+D_{11}, Z_2+D_{12}, \ldots, Z_k+D_{1k}, \ldots, Z_{N_0}+D_{1RS}]$ at corresponding positions in the expanded quantized sequence are obtained based on the basic quantized sequence $Z_1^{N_0}$ during the first round of expansion and the expansion parameter sequence $D_1 = [D_{11}, D_{12}, \ldots, D_{1k}, \ldots, D_{1R}]$, where $R = N_0$. A similar next round of expansion is performed as required.

FIG. 4a shows another update example of expanding $Z_1^8$ into $N_1^{16} \cdot Z_1^8 = [1, 2, 3, 5, 4, 6, 7, 8]$ and $D1 = [0, 0, 0, 1, 0, 1, 1, 4]$ are input. Output obtained after calculation is $Z'_1{}^8 = [1, 2, 3, 6, 4, 7, 8, 12]$.

Subsequent steps 3022b and 3023b are the same as steps 3022a and 3023a, and details are not described herein again.

It should be noted that, D1 indicates an increment of an element change in a unit of 1. In another implementation, the increment may be indicated directly or in a compressed or converted form or the like to reduce storage or indication complexity. A conversion example is as follows: A hexadecimal number or an alphabet is used to indicate a decimal number, for example, 1, 2, 3, 4, 5, 6, 7, 8, 9, A, B, C, D, E, and F indicate 1 to 15, and A, B, C, . . . , X, Y, Z indicate 1 to 26. A compression example is as follows: A decimal system may be converted into a binary system, for example, 0000, 0001, 0010 may be directly indicated by 0, 1, 10. D1=[0, 0, 0, 1, 0, 1, 1, 4] may be indicated by 31, 0, 21, 4 meaning that D1 includes three 1s, 0, two 1s, and 4.

In addition, $Z'_1{}^8 = [1, 2, 3, 6, 4, 7, 8, 12, 5, 9, 10, 13, 11, 14, 15, 16]$ is obtained through one round of expansion. During a next round of expansion, D2 may be [0, 0, 0, 1, 0, 1, 1, 4, 0, 1, 1, 5, 2, 5, 6, 11], and output obtained after calculation is $Z'_1{}^{16} = [1, 2, 3, 7, 4, 8, 9, 16, 5, 10, 11, 18, 13, 19, 21, 27]$.

It should be noted that, the foregoing parameters $P_i$ and $B_i$ or $D_i$, and another expansion parameter that may be used may be known to the system, for example, may be a table agreed on in a standard or a protocol, are stored in a communications node or the communications system, and can be obtained through invoking in a specific execution process. $D_i$ may be alternatively obtained in an implementation of online computation or other form conversion. The parameters used in the implementations of the present invention are merely examples, and another possible parameter is not limited.

Certainly, in addition to the foregoing two expansion rules, there may be another possible expansion rule. In general, the target quantized sequence is obtained by expanding the basic quantized sequence by using a recursion or nesting structure of the polar code. The various implementations of the present invention are not limited.

It should be noted that, the foregoing basic quantized sequence used for the first time may be a sequence agreed on in the system, for example, a basic quantized sequence agreed on in a standard or a protocol. Several basic quantized sequences $N_0$ of different lengths are provided merely as examples at the end of this specification, but this implementation is not limited to an implementation in Table 1.

It should be noted that, the foregoing various basic quantized sequences or target quantized sequences are merely used to reflect a mutual relationship between reliability, and specific meanings thereof may be quantized values of reliability, and may be alternatively quantized values of unreliability. In the foregoing examples, when a quantized value of reliability (higher reliability indicates a higher quantized value) is replaced by a quantized value of unreliability, the expansion rule and the like in the foregoing implementations need to be adaptively adjusted.

For example, in the foregoing implementations, for the obtaining, according to the following formula:

$$Z'_k = Z_k + Bi_j, Z_k \in Z_1^{2^{i-1} N_0}$$

(Calculation condition: $Z_k > Z_{P i_j}$

Assign: $Z_k = Z'_k$, an updated value of a quantized value corresponding to a same polarized subchannel in a currently expanded quantized sequence $Z_k$ and in the basic quantized sequence, the following replacement needs to be performed: a plus sign in the formula is changed to a minus sign, and a greater-than sign is changed to a less-than sign.

In some embodiments, the following is included: determining an element $Z_{P1_1}$ at a position $P1_1$ in $Z_1^{N_1}$, and updating an element that is less than or equal to $Z_{P1_1} - 1$ in $Z_1^{N_1}$ to $Z_i - 1 - B1_1$. An element that is greater than $Z_{P1_1} - 1$ is not updated. In addition, is updated for a plurality of times in a same manner until all elements in P1 or B1 are traversed, and $Z'_1{}^{N_1}$ is obtained after the update is completed. If no element that is greater than or equal to $Z_{P1_j} - 1$ exists in $Z_1^{N_1}$ in an update process, a next round of update is directly performed.

The foregoing expansion method is circularly used based on a length of the target quantized sequence. A quantized sequence obtained after each round of expansion is used as a basic quantized sequence for a next round of expansion. Expansion is performed according to an expansion rule for a current round of expansion, to obtain the target quantized sequence.

A basic quantized sequence corresponding to a target mother code length N is [N–1, N–2, N–3, N–5, N–4, N–6, N–7, N–8].

FIG. 5 shows an operating principle or a processing procedure on a receive side in an implementation of the present invention. On the receive side, a non-fixed bit position set is determined by using a similar method. The method is applied to a polar code decoding process, and includes the following steps.

S501. In some embodiments, perform rate dematching based on a received to-be-processed bit sequence to obtain a to-be-decoded mother code word.

S502. Similar to step S201, a polar code structure determining module 201 determines (or selects) a non-fixed bit position set I. The polar code structure determining module 201 is configured to: generate or obtain a target quantized sequence, and determine the non-fixed bit position set I based on a non-fixed bit length K and the target quantized sequence. Specifically, the following is included:

S5021. Similar to step S201: obtain the target quantized sequence by expanding or extracting a part from (or perform sequential selection in) a basic quantized sequence known to a system. An element included in the basic quantized sequence or the target quantized sequence is used to represent a quantized value of reliability corresponding to a polarized subchannel. Specifically, quantized values can indicate a mutual magnitude relationship between reliability corresponding to various polarized subchannels.

The foregoing polarized subchannel may be uniquely indicated by a sequence number or an index or in another manner. Details are not described herein.

In some embodiments, when a length N of the target quantized sequence is greater than a length of the basic quantized sequence, the basic quantized sequence is expanded according to an expansion rule to obtain the target quantized sequence.

In some embodiments, if a length of the target quantized sequence is less than or equal to a length of the basic quantized sequence, sequential selection is performed in the basic quantized sequence in a front-to-back or back-to-front order to obtain the target quantized sequence.

S5022. Similar to S202: determine the non-fixed bit position set I based on the non-fixed bit length K and the target quantized sequence. Specifically, K quantized values are selected from the target quantized sequence in a descending order of quantized values of reliability. Polarized subchannels corresponding to the K selected quantized values are the non-fixed bit position set.

S503. Perform polar code decoding based on a to-be-decoded bit obtained after the rate de-matching and the non-fixed bit position set I to obtain a decoded bit. Various possible decoding schemes may be used in decoding details. This is not limited in this implementation of the present invention.

For implementation processes of S5021 and S5022, refer to the foregoing implementations. Details are not described again.

In some embodiments, on either the encoding side or the decoding side, a non-fixed bit position set or a fixed bit position set of the polar code can be obtained by using the method or the operating principle and the apparatus provided in the implementations of the present invention, to be applied to the encoding or decoding process.

A person skilled in the art may learn that, because the polar code includes only a non-fixed bit and a fixed bit, determination of the non-fixed bit position set is equivalent to determining of the fixed bit position set. The non-fixed bit may be an information bit or a check bit or even another bit that facilitates decoding. This is not limited in the implementations of the present invention.

The method for determining a polar code structure according to the embodiments of the present invention and the application of the method in polar encoding or decoding are described in detail above with reference to FIG. 1 to FIG. 5. FIG. 2 and FIG. 5 each further provide a polar code encoding and decoding apparatus. For an operating principle or a function of each module, refer to method procedures in FIG. 2 and FIG. 5. Details are not described herein again.

Referring to FIG. 2 or FIG. 5, a polar code encoding and decoding apparatus in a communications system includes a polar code structure determining module (201, 502) and a polar code encoding and decoding module (202, 503).

The polar code structure determining module (201, 502) is configured to: obtain a basic quantized sequence, where the basic quantized sequence includes a quantized value used to represent reliability corresponding to a polarized subchannel; obtain a target quantized sequence based on the basic quantized sequence, where a relative magnitude relationship between elements in the target quantized sequence is nested with a relative magnitude relationship between elements in the basic quantized sequence; and determine K largest quantized values in the target quantized sequence based on a non-fixed bit length K, and use polarized subchannels corresponding to the K largest quantized values, as a non-fixed bit position set.

The polar code encoding and decoding module (202, 503) is configured to perform polar code encoding or decoding based on the non-fixed bit position set determined by the polar code structure determining module (201, 502).

A person skilled in the art may understand that the polar code codec may be implemented by hardware or a combination of software and hardware. An apparatus for determining a polar code structure and a corresponding communications apparatus 600 that can be configured to perform encoding and decoding according to an embodiment of the present invention are described below with reference to FIG. 6.

In some embodiments, the communications apparatus 600 may be configured as a general-purpose processing system, which, for example, is generally referred to as a chip. The general-purpose processing system includes one or more microprocessors providing a function of a processor, and an external memory providing at least a part of a storage medium 603. These are all connected to another supported circuit through an external bus architecture.

In some embodiments, the communications apparatus 600 may be implemented by an ASIC (application-specific integrated circuit) including a processor 602, a bus interface 604, a user interface 606; and at least one part of the storage medium 603 integrated into a single chip; or the communications apparatus 600 may be implemented by one or more FPGAs (field programmable gate arrays). PLDs (programmable logic devices), controllers, state machines, gate logic, discrete hardware components, or any other suitable circuits, or any combination of circuits capable of performing the various functions described throughout the present invention.

Figure 6:
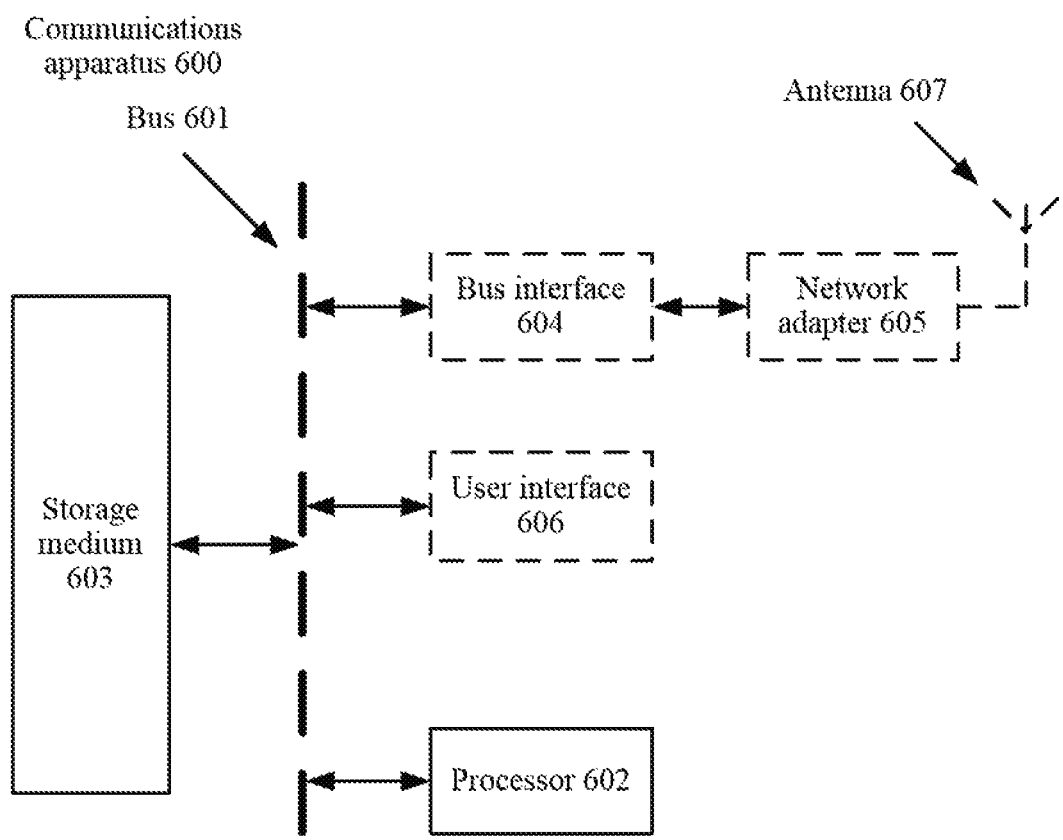
FIG. 6 is a schematic structural diagram of a polar encoding device according to an embodiment of the present invention.

FIG. 6 is a schematic structural diagram of the communications apparatus 600 (for example, a communications apparatus such as an access point, a base station, a station, or a terminal, or a chip in the foregoing communications apparatus) according to an embodiment of the present invention.

In an implementation, as shown in FIG. 6, the communications apparatus 600 may be implemented by a bus 601 as a general bus architecture. The bus 601 may include any quantity of interconnecting buses and bridges based on a specific application and an overall design constraint of the communications apparatus 600. The bus 601 connects various circuits together. These circuits include the processor 602, the storage medium 603, and the bus interface 604. In some embodiments, the communications apparatus 600 uses the bus interface 604 to connect a network adapter 605 and the like through the bus 601. The network adapter 605 may be configured to: implement a signal processing function on a physical layer in a wireless communications network, and send and receive a radio frequency signal by using an antenna 607. The user interface 606 may be connected to a user terminal such as a keyboard, a display, a mouse, or a joystick. The bus 601 may be further connected to other circuits such as a timing source, a peripheral, a voltage regulator, or a power management circuit. These circuits are well known in the art and therefore are not described in detail.

The processor 602 is responsible for bus management and general processing (including executing software stored in the storage medium 1203). The processor 602 may be implemented by one or more general-purpose processors and/or dedicated processors. Examples of the processor include a microprocessor, a microcontroller, a DSP processor, and another circuit capable of executing the software. The software should be interpreted broadly to indicate an instruction, data, or any combination thereof, regardless of whether the software is referred to as software, firmware, middleware, microcode, a hardware description language, or the like.

A figure below shows that the storage medium 603 is separated from the processor 602. However, a person skilled in the art can easily understand that the storage medium 603 or any part thereof may be located outside the communications apparatus 600. For example, the storage medium 603 may include a transmission line, a carrier waveform modulated by using data, and/or a computer product separated from a wireless node. All these media can be accessed by the processor 602 through the bus interface 604. Alternatively, the storage medium 603 or any part thereof may be integrated into the processor 602, and may be, for example, a cache and/or a general-purpose register.

The processor 602 may perform the methods in the foregoing embodiments such as the embodiments shown in FIG. 1a, FIG. 2, FIG. 3, FIG. 3a, and FIG. 5, and corresponding implementations. An execution process of the processor 602 is not described in detail herein again.

The communications apparatus described in the embodiments of this application may be a wireless communications device such as an access point, a station, a base station, or a user terminal.

The polar code described in the embodiments of this application includes, but not limited to, an Arikan polar code, and may be alternatively a CA-polar code or a PC-polar code. The Arikan polar is an original polar code concatenated with no other codes, and includes only an information bit and a frozen bit. The CA-polar code is a polar code concatenated with cyclic redundancy check (Cyclic Redundancy Check, CRC for short), and the PC-polar code is a polar code concatenated with parity check (Parity Check, PC for short). The PC-polar and the CA-polar are concatenated with different codes to improve polar code performance.

The "information bit sequence" described in the embodiments of this application may also be referred to as a "to-be-encoded bit sequence" or an "information bit set". Correspondingly, a "quantity of information bits" may be a quantity of to-be-encoded bits in the to-be-encoded bit sequence, or a quantity of elements in the information bit set.

In the examples described in the embodiments herein, units and method processes may be implemented by electronic hardware or a combination of computer software and electronic hardware. Whether the functions are performed by hardware or software depends on particular applications and design constraint conditions of the technical solutions. A person skilled in the art can implement the described functions by using different methods for each specific application.

In the several embodiments provided in this application, it should be understood that the disclosed apparatus and method may be implemented in other manners. For example, the described apparatus embodiments are merely examples. For example, the unit division is merely logical function division and may be other division in actual implementation. For example, a plurality of units or components may be combined or integrated into another system, or some steps may be ignored or not performed. In addition, coupling, direct coupling, or a communication connection between the units may be implemented by using some interfaces, and these interfaces may be in an electronic form, a mechanical form, or another form.

The units described as separate parts may or may not be physically separate, and may be located in one position or may be distributed on a plurality of network units.

In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk Solid State Disk (SSD)), or the like.

APPENDIX

TABLE 1

$N_0 = 8$
$Z_1^{N_0} = [1, 2, 3, 5, 4, 6, 7, 8]$
$N_0 = 16$
$Z_1^{N_0} = [1, 2, 3, 6, 4, 7, 8, 12, 5, 9, 10, 13, 11, 14, 15, 16]$
$N_0 = 32$

TABLE 1-continued $Z_1^{N_0}$ = [1, 2, 3, 7, 4, 8, 9, 16, 5, 10, 11, 18, 13, 19, 21, 27, 6, 12, 14, 20, 15, 22, 23, 28, 17, 24, 25, 29, 26, 30, 31, 32]
$N_0$ = 64
$Z_1^{N_0}$ = [1, 2, 3, 7, 4, 9, 10, 19, 5, 11, 12, 22, 14, 24, 26, 38, 6, 13, 15, 25, 17, 28, 30, 42, 20, 31, 33, 44, 36, 47, 49, 57, 8, 16, 18, 29, 21, 32, 34, 45, 23, 35, 37, 48, 40, 50, 52, 59, 27, 39, 41, 51, 43, 53, 54, 60, 46, 55, 56, 61, 58, 62, 63, 64]
$N_0$ = 128
$Z_1^{N_0}$ = [1, 2, 3, 7, 4, 9, 10, 20, 5, 11, 13, 24, 15, 27, 30, 47, 6, 14, 16, 28, 18, 32, 35, 53, 21, 36, 39, 57, 43, 62, 66, 85, 8, 17, 19, 34, 22, 37, 40, 59, 26, 42, 46, 65, 50, 69, 73, 91, 31, 48, 52, 71, 55, 75, 78, 96, 61, 80, 84, 100, 88, 104, 106, 117, 12, 23, 25, 41, 29, 45, 49, 68, 33, 51, 54, 74, 58, 77, 81, 98, 38, 56, 60, 79, 64, 83, 87, 103, 70, 89, 92, 107, 95, 110, 112, 121, 44, 63, 67, 86, 72, 90, 93, 108, 76, 94, 97, 111, 101 113, 115, 123, 82, 99, 102, 114, 105, 116, 118, 124, 109, 119, 120, 125, 122, 126, 127, 128]

What is claimed is:

1. A polar code encoding and decoding method in a communications system, comprising:
    obtaining a basic quantized sequence, wherein the basic quantized sequence comprises a quantized value representing a reliability corresponding to a polarized subchannel;
    obtaining a target quantized sequence based on the basic quantized sequence, wherein a relative magnitude relationship between elements in the target quantized sequence is nested with a relative magnitude relationship between elements in the basic quantized sequence;
    determining K largest quantized values in the target quantized sequence based on a non-fixed bit sequence length K, and using polarized subchannels corresponding to the K largest quantized values, as a non-fixed bit position set; and
    performing polar code encoding or decoding based on the non-fixed bit position set.

2. The method according to claim 1, wherein the method is applied to an encoding side, and performing the polar code encoding based on the non-fixed bit position set comprises:
    performing the polar code encoding based on a to-be-encoded non-fixed bit sequence and the non-fixed bit position set to obtain an encoded bit.

3. The method according to claim 1, wherein the method is applied to a decoding side, and performing the polar code decoding based on the non-fixed bit position set comprises:
    performing the polar code decoding based on a to-be-decoded bit sequence and the non-fixed bit position set to obtain a decoded non-fixed bit sequence.

4. The method according to claim 1, wherein obtaining the target quantized sequence based on the basic quantized sequence comprises:
    if a length N of the target quantized sequence is greater than a length of the basic quantized sequence, expanding the basic quantized sequence according to an expansion rule to obtain the target quantized sequence.

5. The method according to claim 1, wherein obtaining the target quantized sequence based on the basic quantized sequence comprises:
    if a length of the target quantized sequence is less than or equal to a length of the basic quantized sequence, performing sequential selection in the basic quantized sequence in a front-to-back or back-to-front order to obtain the target quantized sequence.

6. The method according to claim 4, wherein expanding the basic quantized sequence according to an expansion rule to obtain the target quantized sequence comprises:
    performing expansion based on parameters $P_i=[P_{i1}, P_{i2}, \ldots, P_{ij}, \ldots, P_{iS}]$ and $B_i=[B_{i1}, B_{i2}, \ldots, B_{ij}, \ldots, B_{iS}]$ to obtain the target quantized sequence, wherein element groups $P_{ij}$ and $B_{ij}$ in $P_i$ and $B_i$ indicate that quantized values corresponding to $B_{ij}$ polarized subchannels are inserted after a subchannel whose quantized reliability value is $P_{ij}$ in a basic quantized sequence in this round of expansion, i is a natural number starting from 1, i represents a current round of expansion, j is a natural number ranging from 1 to S, and S is a quantity of polarized subchannel positions to be inserted in an $i^{th}$ round of expansion.

7. The method according to claim 2, wherein expanding the basic quantized sequence according to an expansion rule to obtain the target quantized sequence comprises:
    performing expansion based on an expansion parameter $D_i=[D_{i1}, D_{i2}, \ldots, D_{ik}, \ldots, D_{iR}]$, wherein an element $D_{ik}$ in $D_i$ is used to indicate a change relative to a quantized value on a $k^{th}$ polarized subchannel in the basic quantized sequence, i is a natural number starting from 1, i represents a current round of expansion, k is a sequence number of the polarized subchannel, and R equals to a length of the basic quantized sequence during an $i^{th}$ round of expansion.

8. The method according to claim 1, wherein determining the K largest quantized values in the target quantized sequence based on a non-fixed bit length K comprises:
    determining the K largest quantized values in the target quantized sequence in parallel based on a threshold and the non-fixed bit length K, wherein
    when puncturing is required, the K largest quantized values are K largest quantized values other than a puncturing position.

9. A polar code encoding and decoding apparatus in a communications system, comprising a polar code structure determining module and a polar code encoding and decoding module, wherein
    the polar code structure determining module is configured to:
    obtain a basic quantized sequence, wherein the basic quantized sequence comprises a quantized value used to represent reliability corresponding to a polarized subchannel;
    obtain a target quantized sequence based on the basic quantized sequence, wherein a relative magnitude relationship between elements in the target quantized sequence is nested with a relative magnitude relationship between elements in the basic quantized sequence; and determine K largest quantized values in the target quantized sequence based on a non-fixed bit length K, and use polarized subchannels corresponding to the K largest quantized values, as a non-fixed bit position set; and
    the polar code encoding and decoding module is configured to perform polar code encoding or decoding based on the non-fixed bit position set determined by the polar code structure determining module.

10. The apparatus according to claim 9, wherein the polar code encoding module is configured to perform the polar code encoding based on a to-be-encoded non-fixed bit sequence and the non-fixed bit position set to obtain an encoded bit.

11. The apparatus according to claim 9, wherein the polar code decoding module is configured to perform the polar code decoding based on a to-be-decoded bit sequence and the non-fixed bit position set to obtain a decoded non-fixed bit sequence.

12. The apparatus according to claim 9, wherein a submodule for obtaining the target quantized sequence based on the basic quantized sequence in the polar code structure determining module is configured to:
    if a length N of the target quantized sequence is greater than a length of the basic quantized sequence, expand the basic quantized sequence according to an expansion rule to obtain the target quantized sequence.

13. The apparatus according to claim 9, wherein a submodule for obtaining the target quantized sequence based on the basic quantized sequence in the polar code structure determining module is configured to:
    if a length of the target quantized sequence is less than or equal to a length of the basic quantized sequence, perform sequential selection in the basic quantized sequence in a front-to-back or back-to-front order to obtain the target quantized sequence.

14. The apparatus according to claim 12, wherein the submodule for obtaining the target quantized sequence based on the basic quantized sequence in the polar code structure determining module is configured to:
    perform expansion based on parameters $P_i=[P_{i1}, P_{i2}, \ldots, P_{ij}, \ldots, P_{iS}]$ and $B_i=[B_{i1}, B_{i2}, \ldots, B_{ij}, \ldots, B_{iS}]$ to obtain the target quantized sequence, wherein element groups $P_{ij}$ and $B_{ij}$ in $P_i$ and $B_i$ indicate that quantized values corresponding to $B_{ij}$ polarized subchannels are inserted after a subchannel whose quantized reliability value is $P_{ij}$ in a basic quantized sequence in this round of expansion, i is a natural number starting from 1, i represents a current round of expansion, j is a natural number ranging from 1 to S, and S is a quantity of polarized subchannel positions to be inserted in an $i^{th}$ round of expansion.

15. The apparatus according to claim 12, wherein the submodule for obtaining the target quantized sequence based on the basic quantized sequence in the polar code structure determining module is configured to:
    perform expansion based on an expansion parameter $D_i=[D_{i1}, D_{i2}, \ldots, D_{ik}, \ldots, D_{iR}]$, wherein an element $D_{ik}$ in $D_i$ indicates a change relative to a quantized value on a $k^{th}$ polarized subchannel in the basic quantized sequence, i is a natural number starting from 1, i represents a current round of expansion, k is a sequence number of the polarized subchannel, and R equals to a length of the basic quantized sequence during an $i^{th}$ round of expansion.

16. The apparatus according to claim 9, wherein a submodule for determining the K largest quantized values in the polar code structure determining module comprises:
    determining the K largest quantized values in the target quantized sequence in parallel based on a threshold and the non-fixed bit length K, wherein
    when puncturing is required, the K largest quantized values are K largest quantized values other than a puncturing position.

* * * * *